US007944063B2

(12) United States Patent
Van Haren et al.

(10) Patent No.: US 7,944,063 B2
(45) Date of Patent: May 17, 2011

(54) APPLICATION OF 2-DIMENSIONAL PHOTONIC CRYSTALS IN ALIGNMENT DEVICES

(75) Inventors: Richard Johannes Franciscus Van Haren, Waalre (NL); Sami Musa, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1314 days.

(21) Appl. No.: 11/444,532

(22) Filed: Jun. 1, 2006

(65) Prior Publication Data

US 2006/0279735 A1   Dec. 14, 2006

Related U.S. Application Data

(63) Continuation-in-part of application No. 11/141,202, filed on Jun. 1, 2005, now abandoned.

(51) Int. Cl.
*H01L 23/544* (2006.01)
*H01L 21/76* (2006.01)
*G03F 1/00* (2006.01)

(52) U.S. Cl. ............... 257/797; 257/E23.179; 438/401; 430/5; 977/773

(58) Field of Classification Search .............. 257/797, 257/E23.179; 438/401; 977/773; 430/5
See application file for complete search history.

(56) References Cited

U.S. PATENT DOCUMENTS

| 5,477,309 A | 12/1995 | Ota et al. |
| 6,628,392 B2 | 9/2003 | Kuroda et al. |
| 6,709,949 B2 * | 3/2004 | Hubner ................ 438/401 |
| 6,933,523 B2 | 8/2005 | Sheck |
| 7,616,376 B2 * | 11/2009 | Arsenault et al. ........ 359/321 |
| 2004/0075179 A1 | 4/2004 | Liu et al. |
| 2004/0227945 A1 | 11/2004 | Nohdo |

FOREIGN PATENT DOCUMENTS

| JP | 06-224546 A | 8/1994 |
| JP | 07-254546 A | 10/1995 |
| JP | 2001-060543 A | 3/2001 |
| JP | 2001-168194 | 6/2001 |
| JP | 2001-296442 A | 10/2001 |
| JP | 2004-077885 A | 3/2004 |
| JP | 2004-508711 A | 3/2004 |
| JP | 2005-079249 | * 3/2005 |
| JP | 2005-079249 A | 3/2005 |

OTHER PUBLICATIONS

G. Subramania et al., "Fabrication of three-dimensional photonic cyrstal with alignment based on electron beam lithography", Applied Physics Letters, vol. 85, No. 21, Nov. 22, 2004, pp. 5037-5039.*
Philippe Lalanne, et al., "Antireflection Behavior of Silicon Subwavelength Periodic Structures for Visible Light," Nanotechnology 8 (1997), pp. 53-56.
English translation of Japanese Official Action issued on Jun. 16, 2009 in Japanese Application No. 2006-150762.

* cited by examiner

*Primary Examiner* — W. David Coleman
(74) *Attorney, Agent, or Firm* — Pillsbury Winthrop Shaw Pittman LLP

(57) ABSTRACT

Alignment marks for use on substrates. In one example, the alignment marks consist of periodic 2-dimensional arrays of structures, the spacing of the structures being smaller than an alignment beam but larger than an exposure beam.

22 Claims, 2 Drawing Sheets

APPLICATION OF 2-DIMENSIONAL PHOTONIC CRYSTALS IN ALIGNMENT DEVICES

RELATED APPLICATIONS

This Application is a continuation-in-part of U.S. application Ser. No. 11/141,202 filed Jun. 1, 2005, the entire contents of which is hereby incorporated by reference.

FIELD

The present invention relates to an alignment method and substrate, particularly a method and substrate for use in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The pattern is transferred onto several successive resist layers on the substrate in order to build up a multi-layer structure with the pattern throughout its thickness. It is therefore important to ensure that the pattern in any given layer is exactly aligned with the pattern in the previous layer. Specifically, a substrate is covered with a layer of resist and then the pattern is transferred onto that layer (by a process known as "exposure"). The layer is then treated post-exposure such that the resist is removed except where the pattern was exposed. A subsequent layer of resist is then applied and the pattern transferred/exposed again and treated post-exposure again. This happens several tens of times, depending on the resist and the pattern. Each time a new resist layer is to be exposed, the pattern must be carefully aligned with the pattern of the previous resist layer in order to have a well-defined overall pattern at the end of the series of exposures and post-exposure treatments. The way that successive patterned layers are aligned is by having alignment marks in the layer, these alignment marks being detectable by an alignment beam that is projected by the projection system before the exposure beam is projected to apply the pattern. In order to leave as much space as possible on the substrate for the exposed pattern, the alignment marks are positioned in scribe lanes, which is the part of the substrate that will be sawn to separate the substrate into individual ICs, for example. Alignment marks have, in the past, taken the form of stacked (in several or all the layers) copper areas alternating with dielectric areas.

As lithographic techniques improve and smaller patterns are possible, smaller ICs are also possible and so the area between the scribe lanes decreases. If the scribe lanes stay the same size while the "usable" area between them gets smaller, the ratio of unusable substrate to usable substrate increases, reducing efficiency of the substrate use. The use of relatively large copper areas in the alignment marks in the scribe lanes means that the size of the scribe lanes is difficult to decrease and so inefficient use of substrate space is inevitable. Furthermore users of lithographic apparatuses use the scribe lanes and other non-patterned areas for other non-pattern marks and targets. Smaller or more re-usable alignment marks, are thus desirable.

Alignment marks that are used in the state of the art contain large (e.g. copper) structures (i.e. large compared to the typical device dimensions). For processing reasons, the alignment mark should resemble the device/product dimensions to guarantee alignment accuracy. Therefore, a sub-segmentation is carried out to the large areas (e.g. structures 10 in FIG. 2) inside the mark. For example, the alignment mark consists of copper areas alternated by dielectric areas. If there is sub-segmentation of larger alignment marks to save space, the marks become semi-transparent to certain wavelengths (such as those used for alignment). There can therefore not be "mark-stacking", as marks at the bottom of the stack will have an effect on the diffraction of the radiation beam applied to it. However, mark stacking is a preferred method in the prior art because previous marks do not in that case have to be removed and time and machinery is saved. Furthermore, with mark stacking, marks can be reapplied to the same space, thus saving space over the length of the multiple exposure process.

SUMMARY

It is desirable to create an alignment mark on a substrate that will allow scribe lane space to be decreased and thereby allow more efficient use of the space on a substrate.

It is also desirable to create an alignment mark that is sub-segmented and takes up less space, but that is not transparent and thereby allows mark stacking.

According to an aspect of the invention, there is provided a substrate having provided thereon an alignment mark comprising a periodic array of structures, the structures being separated by a distance that is less than the wavelength of an alignment radiation beam.

According to another aspect of the present invention, there is provided a lithographic apparatus comprising a substrate table for supporting a substrate; a patterning means for imparting a pattern to a radiation beam; and projection system for projecting the patterned radiation beam onto a target area of the substrate, wherein the substrate is provided with an alignment mark comprising a periodic array of structures, the structures being separated by a distance that is less than the wavelength of an alignment radiation beam.

According to a further aspect of the present invention, there is provided an inspection method for inspecting the alignment of a pattern on a substrate, comprising: providing a periodic array of reflective structures on a substrate; illuminating the array with an alignment radiation beam comprising a wavelength that is greater than the distance between the structures; detecting the reflected alignment radiation beam; and determining, from the properties of the reflected beam, whether the array is in alignment with the pattern.

According to a yet further aspect of the present invention, there is provided a method for creating an alignment mark on a substrate, comprising: depositing, onto the substrate, a layer containing periodic two-dimensional arrays of structures with a periodic variation in refractive index, the spacing between the structures being smaller than the wavelength of an intended alignment beam.

According to a yet further aspect of the present invention, there is provided a device manufacturing method comprising projecting a patterned beam of radiation onto a substrate, wherein the substrate contains an alignment mark made of a periodic two-dimensional array of structures, the distance between the structures being smaller than the wavelength of an alignment beam, but larger than the wavelength of the patterned beam.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
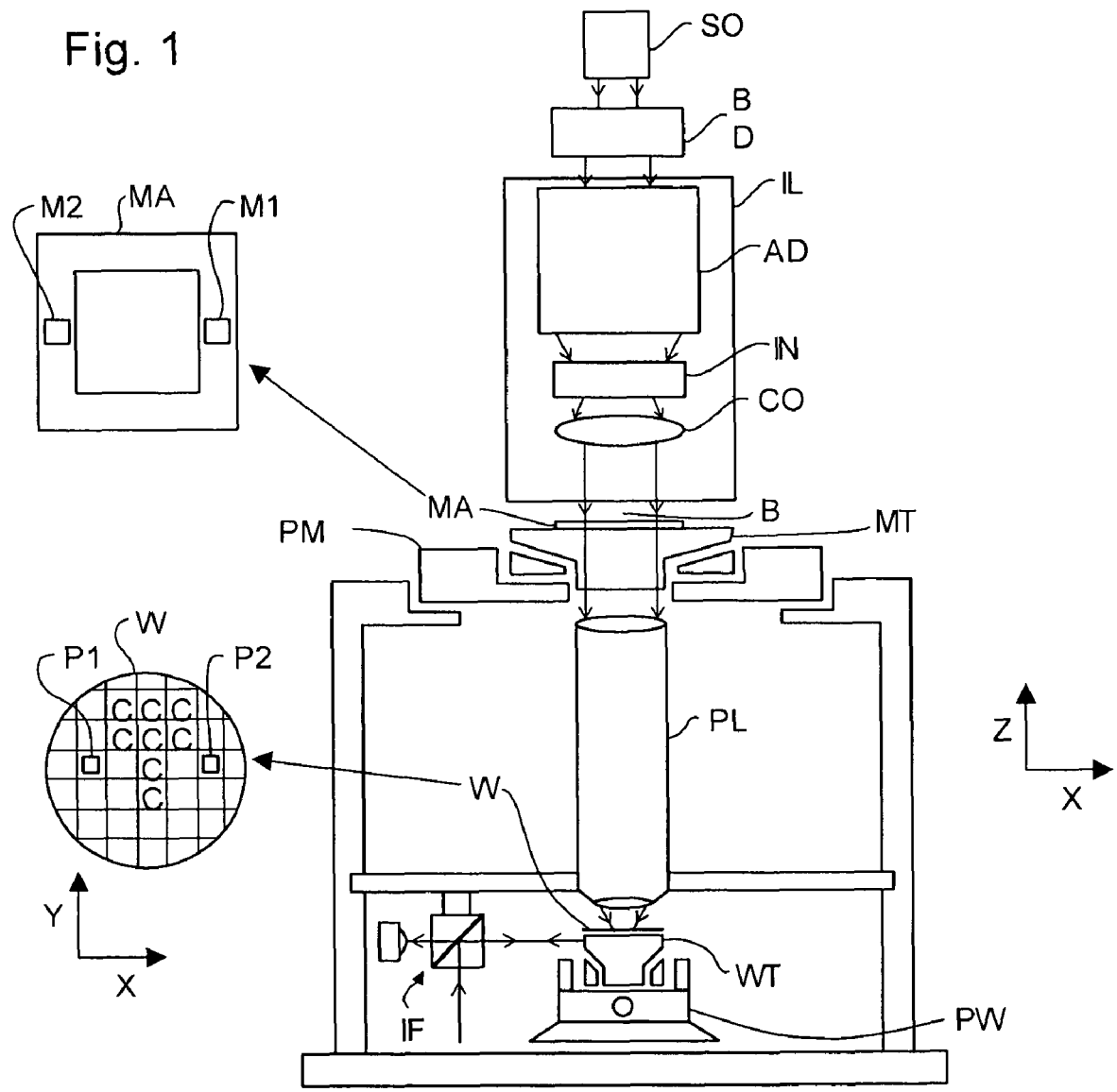
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or visible light radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as r-outer and a-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

It is important to ensure that each time the exposure beam is projected onto the substrate, that it is aligned with the pattern already existing on the substrate. In order to do this, alignment marks are present each time a layer of resist is applied, and the exposure is carried out by an exposure beam once an alignment beam projected from the same projection system has used the alignment marks to ensure that the projection system and patterning means are aligned with the substrate and with the existing pattern (and alignment marks) on the substrate.

The key to reducing the space used by alignment marks in the scribe lanes is to have alignment marks that can be detected by the scattering of an alignment beam, but that do not affect an exposure beam. This may lead to alignment marks being incorporated in the pattern, without compromising the pattern. This, in turn, reduces the space required in scribe lanes, reducing scribe lane space merely to that required for sawing.

Alternatively, the alignment marks may be made such that they can be stacked on each other so that the same spots on the substrate may be used for every alignment mark in every new application (or layer) of resist. The way this is done is by creating an alignment mark that is not transparent to an alignment beam, but may be transparent to an exposure beam as described below.

The present invention uses the fact that the exposure wavelength is much smaller than the alignment wavelength. An alignment wavelength may be infra-red or visible light, for example (i.e. any wavelength that will not affect the resist layers on the substrate), while an exposure wavelength is usually ultra-violet or similar.

Sub-wavelength periodic arrays of structures may therefore be created on the substrate that will be detectable by the alignment beam, but not by the exposure beam. Such periodic 2-D arrays act as artificial crystals for the alignment wavelength. The macroscopic optical properties of such a crystal, for example, the effective real and imaginary parts of the refractive index, can be controlled accurately by the shape of the structure and the periodicity of the 2-D arrays. This means that the macroscopic optical properties of the substrate may be tailored for the alignment wavelength. In particular, the alignment beam may be caused to scatter with a specific scatter spectrum when the alignment mark is aligned with the projection system transmitting the alignment beam. A detector positioned to detect the scatter spectrum then calculates whether the alignment beam is aligned by analyzing its spectrum, and by how much it is misaligned by changed parameters in the spectrum. The tailoring of the optical properties of the substrate is a consequence of the fact that the wavelength of the exposure beam is (much) smaller than the wavelength of the alignment beam. The optical properties for the wavelength of the alignment beam are controlled by making use of the imaging capabilities of the wavelength of the exposure beam.

As these "artificial crystals" are not transparent to the alignment beam (because its wavelength is such that the alignment beam is scattered by the alignment mark but does not pass through it to be affected by alignment marks in lower layers), the alignment marks made of these artificial crystals may be stacked, thus using up far less space than if a new space for alignment marks had to be found for each layer of resist. In other words, alignment marks placed in successive layers can be placed in the same area of the substrate, such that for example, the total substrate area needed to accommodate N equal size alignment marks, located one each within N layers, is roughly the area used by a single alignment mark.

Figure 2:
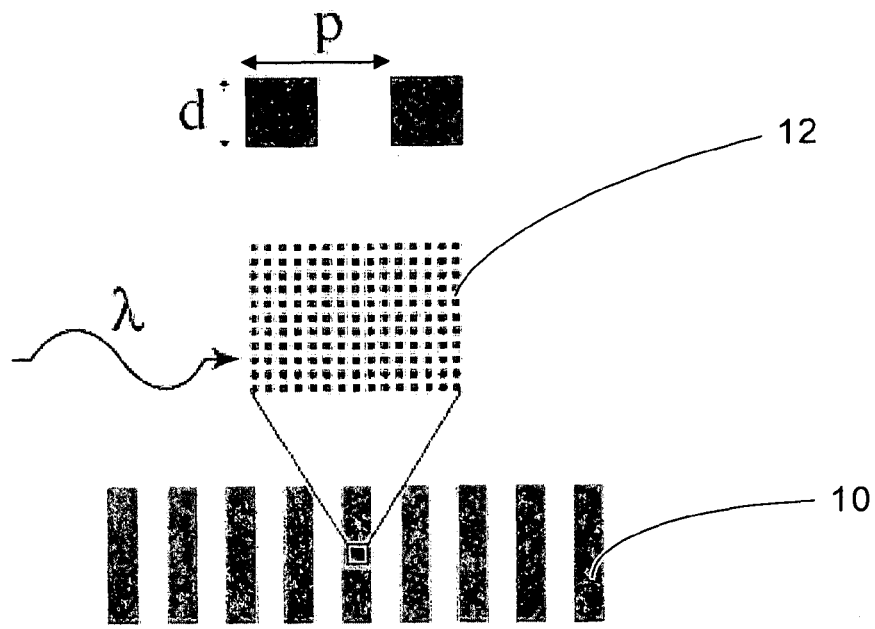
FIG. 2 depicts an alignment mark according to a first embodiment of the present invention.

FIG. 2 shows an example of an alignment mark based on a two-dimensional photonic crystal. In this embodiment, the dark columns 10 are made up of 2-D arrays 12 of contact holes. The reflectivity of the alignment marks is directly linked to the macroscopic refractive index and so the alignment marks can be effectively made of two "parts"; the macroscopic part, which comprises the columns 10 and the microscopic part, which comprises the structures 12. The macroscopic part affects the refractive index and the microscopic part gives the characteristics of the artificial crystal. A structure can be any repetitive feature that forms an artificial crystal for the wavelength of the alignment beam (1-D or 2-D). In practice, it is likely that the feature will be a contact hole. It may also be a "brick" like structure such as that used in deep trench applications. For instance, in a copper damascene process, arrays of holes are printed, etched in Silicon-Oxide and filled with copper. The excess copper is polished away.

In one example, both the feature size d and the pitch p of the array as shown in FIG. 2 are much smaller than the wavelengths of the alignment beam. Pitch p must be smaller than the wavelength of the alignment beam, whereas feature size d may optionally be smaller. By providing these structures, or contact holes, that are smaller than the alignment beam wavelength, but larger than the exposure beam wavelength, artificial materials are created with controlled optical properties. The optical properties may be the real (refractivity or reflectivity) and imaginary (absorption) part of the effective refractive index. Artificial materials with controlled optical properties for the alignment wavelengths can be made by making use of lithographic techniques, i.e. when these alignment techniques are used in lithography, the lithographic apparatus itself may be used to create the alignment marks. By providing microscopic columns 10 that contain microscopic structures 12 having a grating period smaller than the wavelength of alignment beam, the incident (alignment) light cannot resolve the microscopic features 12, and therefore "sees" the microscopic structure 10 as a homogenous medium. This homogenous medium hasan effective refractive index (both real and imaginary) that is dependent on the refractive indices of the material making up the structure and the geometry of the structure (i.e. the period and duty cycle.)

Figure 3:
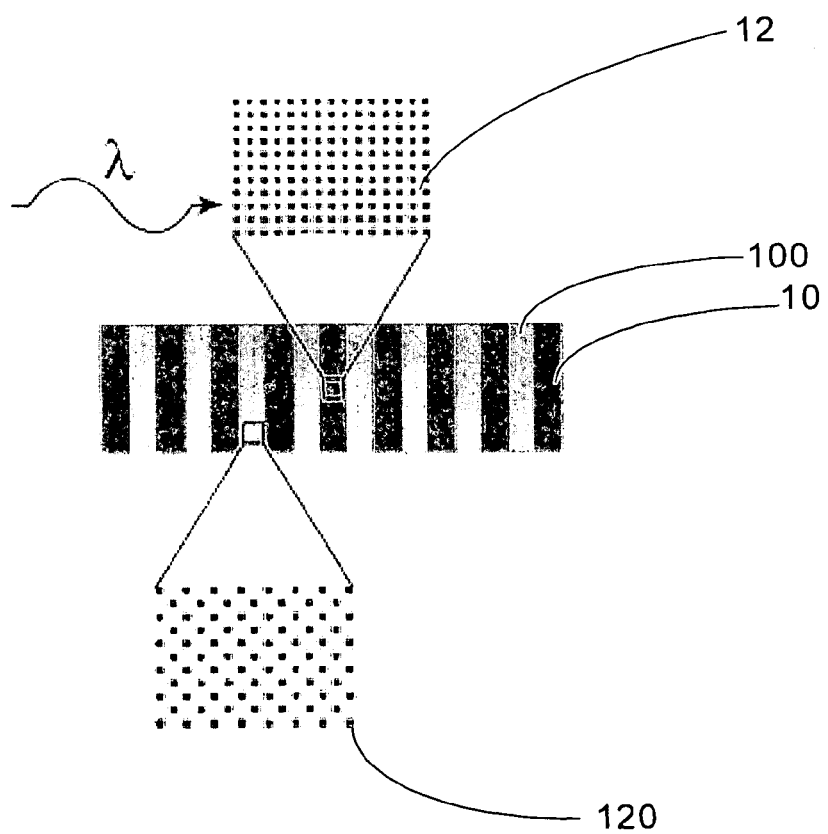
FIG. 3 depicts an alignment mark according to a second embodiment of the invention.

An alternative embodiment of the alignment mark is shown in FIG. 3. The same columns 10 contain the same shape and spacing of array 12 as in FIG. 2. However, between the columns 10 are columns 100 containing a different array 120 with structures or contact holes that have a different orientation and periodicity from the array 12 of columns 10. Accordingly, the optical properties (reflectivity, absorption, etc.) are different in columns 10 as compared to columns 100. Alignment marks based on differences in optical properties may be designed to replace stacked copper marks.

The advantage of this alignment mark system is that the optical properties of a substrate as perceived by an alignment beam may be created and tailored using the exposure beam at the exposure beam wavelength because its wavelength is smaller and therefore able to create smaller features than the alignment beam can recognize. Furthermore, polarization differences in the directions parallel to the substrate surface can be avoided or controlled. While a sub-segmentation can be added in one direction only (1-D), the interaction of the wavelength of the alignment beam depends on the polarization state, and by making use of 2-D periodic arrays, the optical properties of resulting material can be made isotropic for the wavelength of the alignment beam. The polarization sensitivity depends on the geometry of the structures, which are generally symmetrical features, such as squares and circles, and which lead to marks that are polarization insensitive.

The alignment marks can also be applied to other process layers, such as a deep trench layer, local inter-connect layers, etc. The periodic 2-D arrays can be applied in alignment marks but also as anti-reflection layers.

These photonic crystal alignment marks in substrates may also be subwavelength surfaces that are etched into silicon substrates and exhibit antireflection characteristics. They may be made by holographically recording a crossed-grating in a photoresist mask followed by reactive-ion etching to transfer the primary mask onto the substrate (e.g. using the exposure beam). More information on how this sort of structure may be made may be found in "Antireflection behaviour of silicon subwavelength periodic structures for visible light", Lalanne and Morris, Nanotechnology 8 (1997) 53-56, hereby incorporated by reference.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A substrate having provided thereon an alignment mark comprising a periodic array of structures, the structures being separated by a distance that is less than the wavelength of an alignment radiation beam such that when the structures are illuminated by the alignment radiation beam a pattern is produced when the alignment mark is aligned with the alignment radiation beam.

2. A substrate according to claim 1, wherein the periodic array comprises a photonic crystal.

3. A substrate according to claim 1, wherein the structures are contact holes.

4. A substrate according to claim 1, wherein the alignment mark is 2-dimensional.

5. A substrate according to claim 1, wherein the alignment mark comprises a first column containing a first array of structures, and a second column containing no structures.

6. A substrate according to claim 1, wherein the alignment mark comprises a first column containing a first array of structures, and a second column containing a second array of structures arranged in a different pattern and/or with a different periodicity from the first array.

7. A substrate according to claim 1, wherein the alignment mark comprises a first column with a predetermined refractive index, and a second column with a different refractive index from the first column.

8. A substrate according to claim 1, wherein the alignment mark is applied to one or more resist layers on the substrate.

9. A substrate according to claim 1, wherein the alignment mark is applied to a deep trench layer.

10. A substrate according to claim 1, wherein the alignment mark is applied to a process layer in a lithographic apparatus.

11. A substrate according to claim 1, wherein the substrate comprises a stacked configuration of alignment marks.

12. A substrate according to claim 1, wherein a pattern and periodicity of the periodic array affects the real and imaginary parts of the refractive index of an alignment feature containing the periodic array.

13. A substrate according to claim 1, for use in a lithographic apparatus comprising an exposure tool for exposing a pattern onto the substrate using an exposure beam, wherein the structures are larger than the wavelength of the exposure beam.

14. A substrate according to claim 1, wherein the pattern is a scatter spectrum.

15. A substrate according to claim 5, wherein the alignment mark comprises alternating first and second columns.

16. A substrate according to claim 6, wherein the alignment mark comprises alternating first and second columns.

17. A substrate according to claim 7, wherein the alignment mark comprises alternating first and second columns.

18. An inspection method for inspecting the alignment of a pattern on a substrate, comprising:
    illuminating a periodic array of reflective structures on a substrate with an alignment radiation beam comprising a wavelength that is greater than the distance between the structures;
    detecting, with a detector, the reflected alignment radiation beam; and
    determining from the properties of the reflected beam, whether the array is in alignment with the pattern.

19. A method for creating an alignment mark on a substrate, comprising:
    depositing, onto the substrate, a layer containing a periodic 2-dimensional array of structures, the array having a periodic variation in refractive index, and the spacing between the structures being smaller than a wavelength of an alignment beam such that when the structures are illuminated by the alignment beam a pattern is produced when the alignment mark is aligned with the alignment beam.

20. A method according to claim 19, wherein a distance between the structures is greater than a wavelength of an exposure beam.

21. A device manufacturing method, comprising projecting a patterned beam of radiation onto a substrate, wherein the substrate contains an alignment mark made of a periodic 2-dimensional array of structures, the distance between the structures being smaller than the wavelength of an alignment beam, but larger than the wavelength of the patterned beam such that when the structures are illuminated by the alignment beam a pattern is produced when the alignment mark is aligned with the alignment beam.

22. A device manufactured according to the method of claim 21.

* * * * *